(12) United States Patent
Crotty et al.

(10) Patent No.: US 10,171,085 B2
(45) Date of Patent: *Jan. 1, 2019

(54) NOISE-IMMUNE REFERENCE (NREF) INTEGRATED IN A PROGRAMMABLE LOGIC DEVICE

(71) Applicant: AnDAPT, Inc., San Jose, CA (US)

(72) Inventors: Patrick J. Crotty, San Jose, CA (US); John Birkner, Woodside, CA (US); Kapil Shankar, Saratoga, CA (US)

(73) Assignee: AnDAPT, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/921,201

(22) Filed: Mar. 14, 2018

(65) Prior Publication Data

US 2018/0205381 A1     Jul. 19, 2018

Related U.S. Application Data

(63) Continuation of application No. 15/656,982, filed on Jul. 21, 2017, now Pat. No. 9,954,535.

(60) Provisional application No. 62/365,319, filed on Jul. 21, 2016.

(51) Int. Cl.
*H03K 19/177*     (2006.01)
*G06F 7/38*     (2006.01)
*H03G 3/20*     (2006.01)
*H03G 1/00*     (2006.01)

(52) U.S. Cl.
CPC ......... *H03K 19/17764* (2013.01); *H03G 3/20* (2013.01); *H03K 19/17728* (2013.01); *H03K 19/17744* (2013.01); *H03G 1/0088* (2013.01)

(58) Field of Classification Search
CPC ....... H03K 19/17764; H03K 19/17728; H03K 19/17744; H03G 3/20
USPC .......................................................... 326/40
See application file for complete search history.

(56) References Cited

U.S. PATENT DOCUMENTS

| 5,267,273 A * | 11/1993 | Dartois | H03K 23/662 375/355 |
| 2008/0048773 A1* | 2/2008 | Fahim | H03F 3/45475 330/9 |
| 2008/0285698 A1* | 11/2008 | Mallinson | G06F 1/025 375/376 |

\* cited by examiner

*Primary Examiner* — Daniel D Chang
(74) *Attorney, Agent, or Firm* — Innovation Counsel LLP

(57) ABSTRACT

A reference voltage block integrated in a programmable logic device (PLD) includes: an accumulator comprising an adder and a register and configured to receive a digital reference value and generate a carry out signal; a low-pass filter configured to receive the carry out signal from the accumulator and generate a filtered signal; and a variable analog gain amplifier configured to amplify the filtered signal using a gain selected from a predetermined set of gains and generate a reference voltage output signal. The PLD includes a programmable fabric and a signal wrapper that is configured to provide signals between the reference voltage block and the programmable fabric. The digital reference value and the predetermined set of gains of the reference voltage block are programmably using the programmable fabric and fed to the reference voltage block via the signal wrapper.

20 Claims, 15 Drawing Sheets

| CO1 | CO2 | Delay CO2 | Output |
|---|---|---|---|
| 0 | 0 | 0 | (0, 1, 0) |
| 0 | 0 | 1 | (0, 0, 0) |
| 0 | 1 | 0 | (1, 0, 1) |
| 0 | 1 | 1 | (0, 1, 0) |
| 1 | 0 | 0 | (1, 0, 1) |
| 1 | 0 | 1 | (0, 1, 0) |
| 1 | 1 | 0 | (1, 1, 1) |
| 1 | 1 | 1 | (1, 0, 1) |

FIG. 6D

| | 0 | 1 | 1.5 | 3 | 5 |
|---|---|---|---|---|---|
| 0 | | 0 | 0 | 0 | 0 |
| 1 | | 0.0012 | 0.0018 | 0.0035 | 0.0059 |
| 2 | | 0.0023 | 0.0035 | 0.0070 | 0.0117 |
| ... | | ... | ... | ... | ... |
| 1021 | | 1.1965 | 1.7947 | 3.5895 | 5.9824 |
| 1022 | | 1.1977 | 1.7965 | 3.5930 | 5.9883 |
| 1023 | | 1.1988 | 1.7982 | 3.5965 | 5.9941 |

FIG. 7

NOISE-IMMUNE REFERENCE (NREF) INTEGRATED IN A PROGRAMMABLE LOGIC DEVICE

CROSS-REFERENCE TO RELATED APPLICATION(S)

This application is a continuation of U.S. patent application Ser. No. 15/656,982 filed Jul. 21, 2017, which claims the benefits of and priority to U.S. Provisional Patent Application Ser. No. 62/365,319 filed Jul. 21, 2016, the disclosures of which are incorporated herein by reference in their entirety.

TECHNICAL FIELD

The present disclosure relates generally to programmable logic devices (PLDs), more particularly, to a noise-immune reference (Nref) integrated in a PLD.

BACKGROUND

Programmable logic devices (PLDs) such as programmable logic array (PLA) devices, programmable array logic (PAL) devices, and field-programmable gate arrays (FPGAs) have been in the market place for a long time. These PLDs can be programmed by users for a wide variety of applications and industries. Functional blocks have been integrated to expand the capabilities of the PLDs. These functional blocks can be digital and/or analog that are designed to perform specific functions to complement or supplement the programmable components of the PLDs.

PLDs can have internal elements or fabrics that are programmable and connected together to perform a specific function. More complex devices can add functional blocks to the programming fabrics. These functional blocks can be a combination of digital and analog circuitry, such as a serial interface, a voltage reference, a comparator, an analog-to-digital (A/D) converter, etc. Some devices can be optimized for speed, power, flexibility, complexity, and/or cost. These devices can interface with the external world via input/output (I/O) pins. These I/O pins can typically function up to 5V and sourcing/sinking current up to 50 mA.

Some power applications such as a power regulator and a power converter may require a higher voltage and/or a higher current that the devices and their I/O pins can handle. Users can add an external discrete high-voltage power MOSFET to an existing PLD to expand its application to high-voltage/current power applications. The discrete high-voltage power MOSFET requires another package, adding more cost and requiring more board space.

SUMMARY

A reference voltage block integrated in a programmable logic device (PLD) includes: an accumulator comprising an adder and a register and configured to receive a digital reference value and generate a carry out signal; a low-pass filter configured to receive the carry out signal from the accumulator and generate a filtered signal; and a variable analog gain amplifier configured to amplify the filtered signal using a gain selected from a predetermined set of gains and generate a reference voltage output signal. The PLD includes a programmable fabric and a signal wrapper that is configured to provide signals between the reference voltage block and the programmable fabric. The digital reference value and the predetermined set of gains of the reference voltage block are programmably using the programmable fabric and fed to the reference voltage block via the signal wrapper.

According to another embodiment, a programmable logic device (PLD) includes: a reference voltage block; a programmable fabric; and a signal wrapper configured to provide signals between the reference voltage block and the programmable fabric. The reference voltage block includes: an accumulator comprising an adder and a register and configured to receive a digital reference value and generate a carry out signal; a low-pass filter configured to receive the carry out signal from the accumulator and generate a filtered signal; and a variable analog gain amplifier configured to amplify the filtered signal using a gain selected from a predetermined set of gains and generate a reference voltage output signal. The digital reference value and the predetermined set of gains of the reference voltage block are programmably using the programmable fabric and fed to the reference voltage block via the signal wrapper.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the various embodiments given below serve to explain and teach the principles described herein.

FIG. 6D is a table showing inputs and outputs to an encoder block included in the DAC, according to one embodiment;

FIG. 7 shows examples of target reference voltages and the corresponding gain multipliers;

Figure 1:
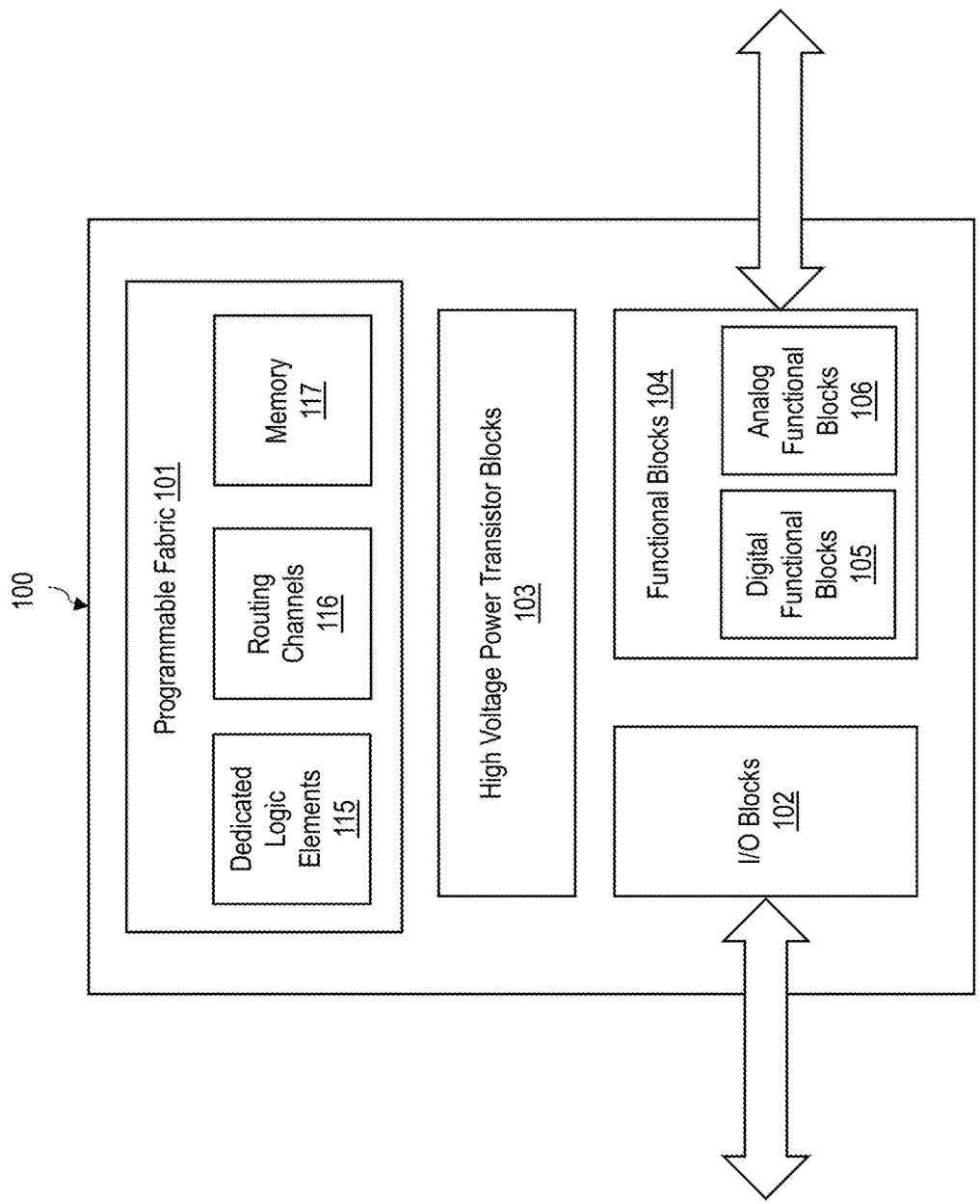
FIG. 1 shows a block diagram an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a noise-immune reference (Nref) integrated in a PLD. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure generally describes a programmable logic device (PLD) integrated with various building blocks for providing a power solution and minimizing cost to market and a board space. In particular, the present disclosure relates to a noise-immune reference (Nref) block integrated in the PLD. The Nref block is wrapped around by a signal wrapper that can provide an interface to the programmable fabric of the PLD using digital/analog I/Os and internal signals included in the programmable fabric.

The present PLD can provide a power management platform for high-voltage and high-power applications such as power management, power converters, industrial control, automobile, etc. using one or more integrated power blocks. The present PLD can be used to integrate dissimilar rails on a single chip.

The PLD can be configured as various types of regulators, switches, muxes, battery chargers, switching controllers, gate drivers, etc. Example configurations of the PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Each of the power blocks integrated in the present PLD has an on-demand topology for use in various applications. The present PLD can lower the power consumption by on-demand power on/off and sequencing rails, and on-demand monitoring to handle throttle conditions and marginal loads. In one embodiment, the present PLD can be configured as an on-demand multiple point-of-load (POL) integrator in various forms of power converters such as a point-of-load (POL) converter, a POL regulator, a POL module, and a POL system. Depending on a target application, the PLD can be programmed to function as an integrator combining one or more of a buck regulator (either current or voltage mode), a boost regulator, a buck-boost regulator, a low drop-out (LDO) regulator, a load switch, a mux, a battery charger, an external switching controller, and a gate driver. The PLD can also be programmed to function as a pulse width modulator (PWM) for providing constant current (CC) in a current mode or a constant voltage (CV) in a voltage mode, a pulse frequency modulator (PFM), or a pulse skipping modulator (PSM).

The present PLD can integrate one or more applications targeted for dissimilar rails to reduce a board size and lower a package cost. The present PLD enables a telemetry across different rails using one or more generic interfaces such as general-purpose input/output (GPIO), I2C interface, and serial peripheral interface (SPI) over the digital and analog I/O pins that can include physical pads. Using one or more of these interfaces or over a power management bus (e.g., PMBus™), the present PLD can communicate with an external device for a telemetry and a remote control. The present PLD can use the telemetry and the remote control for creating and integrating multiple dissimilar POLs. The present PLD can provide digital multiphase operation, for example, auto align/spread phases.

FIG. 1 shows a block diagram an example programmable logic device (PLD), according to one embodiment. The PLD 100 includes a programmable fabric 101, one or more I/O blocks 102, one or more high voltage power transistor blocks 103, and one or more functional blocks 104. In some embodiments, the PLD 100 is referred to as a power management integrated circuit (PMIC). The PMIC can convert one or more low power voltage inputs to one or more high power voltage outputs or convert one or more high voltage inputs to one or more low power voltage outputs.

The programmable fabric 101 includes a number of uncommitted programmable logic elements including one or more dedicated logic elements 115 and routing channels 116. The dedicated logic elements 115 can include a plurality of flip flops and logic gates. The dedicated logic elements 115 and the routing channels 116 of the programmable fabric 101 can be programmed to selectively and programmably connect the I/O blocks 102, the high voltage power transistor blocks 103, and the dedicated logic elements 115 via the routing channels 116 to form one or more dedicated functions.

The programmable fabric 101 can include a memory 117 including a volatile memory (e.g., a static random-access memory (SRAM)), a non-volatile memory (e.g., a flash memory), or both. The memory 117 may include one or more look-up tables for digital compensation.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The PLD 100 can include any number of high voltage power transistor blocks, for example, four, eight, and twelve depending on a size of the chip and requirement for an intended application. The high voltage power transistor blocks 103, herein also referred to as scalable integrated MOSFET (SIM) blocks, can be configured and programmed to be a constituent block or element of a more complex circuit or device. In one embodiment, the high voltage power transistor blocks 103 can support voltages ranging from 12V to 80V and current up to 12 A. The voltage and current limits that the high voltage power transistor blocks 103 can support may vary depending on an intended power application and the process technology used for manufacturing the PLD 100. According to one embodiment, the high voltage power transistor blocks 103 can integrate both n-channel and p-channel FETs.

According to one embodiment, the source and the drain of each the high voltage power transistors in the high voltage power transistor blocks 103 can be connected to external circuits and/or devices. The I/O pins of the I/O blocks 102 are primarily used for interfacing digital and analog sensory signals to and from an external device or component, and may not include the source and drain (or boost pin) of the high voltage power transistors. The presence of one or more high voltage power transistors on the same chip can provide flexible configurations of the PLD 100 by programming the programmable fabric 101. For example, different high voltage power transistors on the same chip can connect to different external power rails or sensor hubs. In another example, the high voltage power transistors can be externally connected in series via the source and the drain of the high voltage power transistors. The programmable fabric 101 can be programmed to connect the I/O blocks 102, the high voltage power transistor blocks 103, and the integrated logic elements 115 using the programmable routing channels 116 in various configurations to accommodate a wide range of power applications.

The functional blocks 104 can include one or more of digital functional blocks 105, analog functional blocks 106, or a combination of both. A digital functional block 105 can provide dedicated functions such as a serial interface, a communication protocol, and an application-specific control function. An analog functional block 106 can be an analog-to-digital converter (ADC), a comparator, a sensor, an amplifier, a voltage reference, a digital-to-analog converter (DAC), etc. The parameters of each of these functional blocks 104 such as a gain, a reference voltage, a frequency, a resolution can be configured by the programmable fabric 101. In addition, the programmable fabric 101 can programmably connect different functional elements within the functional blocks 104. Some of the functional blocks 104 such as a reference voltage can be available via external pins of the I/O blocks 102.

According to one embodiment, the programmable fabric 101 can take a form of a field programmable gate array (FPGA). The FPGA contains an array of programmable logic blocks (e.g., the dedicated logic elements 115) and reconfigurable interconnects (e.g., the routing channels 116) to programmably wire the logical blocks together using the reconfigurable interconnects. The logic blocks may include simple logic gates like AND gates and XOR gates and flip-flops or more complex blocks such as memory elements. The logic blocks and the reconfigurable interconnects can be configured to perform complex combinational functions in conjunction with the functional blocks 104.

According to one embodiment, the programmable fabric 101 may include a digital fabric and an analog fabric. The digital fabric corresponds to a portion of the programmable fabric 101 that provides digital interfaces among the constituent blocks including the I/O blocks 102, the high voltage power transistor blocks 103, and the digital functional blocks 105. For example, the digital fabric can provide the connectivity among the integrated analog blocks, digital logic elements, timers, I/Os, etc. The analog fabric corresponds to a portion of the programmable fabric 101 to provide analog interfaces with one or more external telemetry and sensor blocks, an I2C interface, an SPI interface, etc.

According to one embodiment, a high voltage power transistor implemented in the high voltage power transistor blocks 103 is a software-defined and programmable, configurable, optimizable, and scalable power MOSFET. The PLD 100 including such power MOSFETs can accelerate time to market for new products and standards and achieve a competitive response while lowering the capital and operational expenditure, and inventory. The programmability of the present PLD can provide flexibility in design and facilitate the implementation of user-configurable and field-programmable solutions and topologies in a developmental stage of a new product as well as in a commercialization stage for providing optimizable solutions to customers by offering flexible solutions depending on the needs and requirements of a target application.

The present PLD includes one or more analog functional blocks that are adaptive for providing various user-configurable analog functions. The adaptive analog blocks are wrapped with respective signal wrappers on the programmable fabric. The programmable fabric provides a programmable environment to build user-configurable custom analog functions by digitally or combining one or more adaptive analog blocks by selectively and programmably interconnecting and combining the signal wrappers that provide interface to the adaptive analog blocks. The signal wrappers of the adaptive analog blocks eliminate the need to directly interconnect and/or interface analog blocks in an analog fashion with a variety range of voltages, currents, common mode, isolation, noise isolation issues, or the like. Using the present adaptive analog blocks, analog functions can be readily built on demand targeting specific applications while meeting the requirements for the target applications.

According to one embodiment, the present disclosure provides an analog and digital adaptive platform for implementing various analog functions using adaptive analog blocks that are configurable and programmable in a digital domain. The adaptive analog blocks that are wrapped with signal wrappers can provide ease of fabrication and packaging various custom analog functions in a small chip size with a low cost compared to conventional analog ICs. The present adaptive platform can provide flexibility and adaptability for various circuit designs and implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The signal wrapper of the present adaptive platform can provide a digital PID control to various analog actuators including, but not limited to, DC motors, servo motors, stepper motors, motion control, breakers, fan controllers.

Figure 2A:
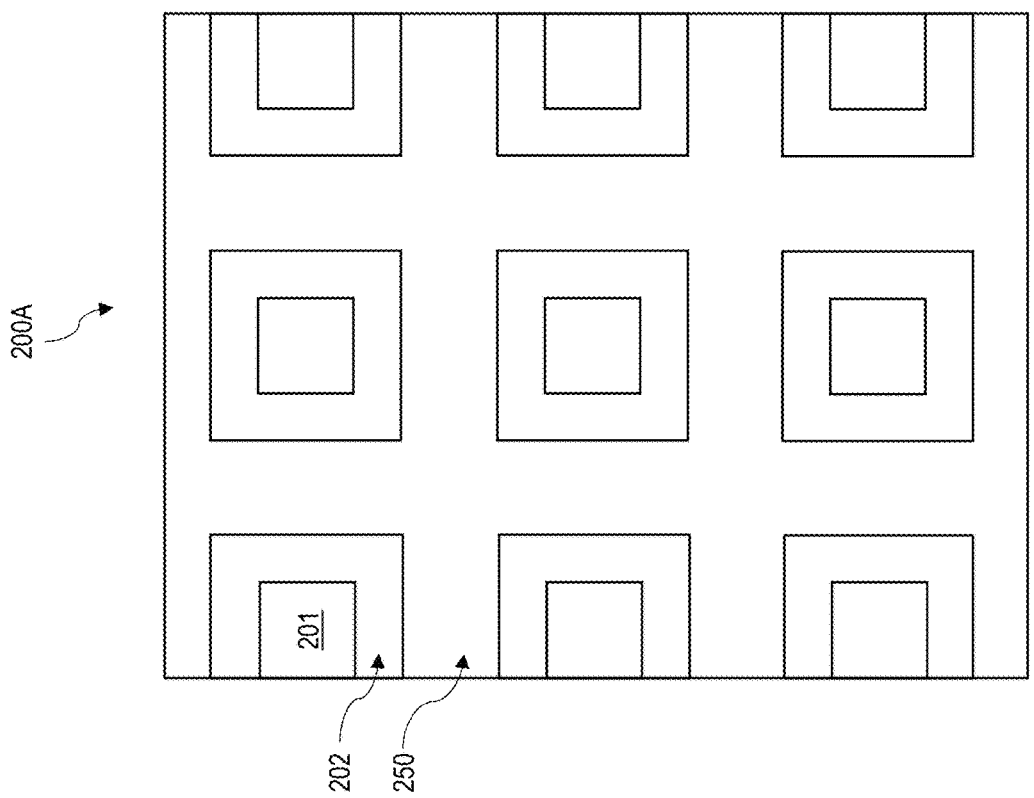
FIG. 2A illustrates a schematic block diagram of an analog and digital adaptive platform, according to one embodiment.

FIG. 2A illustrates a schematic block diagram of an analog and digital adaptive platform, according to one embodiment. The analog and digital adaptive platform 200A includes a plurality of analog and digital adaptive blocks 201 interconnected with signal wrappers 202 on a programmable fabric 250. Referring to FIG. 1, the adaptive blocks 201 correspond to any of the high voltage power transistor blocks 103, the digital functional blocks 105, and the analog functional blocks 106. Each of the adaptive blocks 201 arranged on the programmable fabric 250 is user-configurable and programmable by the coupled signal wrapper 202 to provide a user-configurable function for a target application or one or more circuit components of a target application.

A signal wrapper 202 provides an interface circuitry required for the coupled adaptive block 201 to interconnect with another adaptive block 201 and/or an I/O block (e.g., I/O block 102 of FIG. 1) via the programmable fabric 250. According to one embodiment, the analog and digital adaptive platform 200A includes a predetermined number of adaptive blocks 201. Examples of the adaptive blocks 201 include, but are not limited to, an analog-to-digital converter (ADC) block, a comparator block, a memory block, a pulse-width modulation (PWM) block, a voltage reference block, and a timer block. In conjunction with one or more programmable analog and digital input/output (I/O) blocks (e.g., the I/O blocks 102 of FIG. 1), these adaptive blocks 201 can be programmably configured to build a variety of analog circuitry for various applications via the programmable fabric 250.

According to one embodiment, a signal wrapper 202 can include both a digital wrapper for providing interfaces for digital signals and an analog wrapper for providing interfaces for analog signals to the corresponding adaptive blocks 201. The programmable fabric 250 can include a digital fabric and an analog fabric. In this case, the digital wrapper of the signal wrapper 202 interfaces with the digital fabric of the programmable fabric 250, and the analog wrapper of the signal wrapper 202 interfaces with the analog fabric of the programmable fabric 250.

According to one embodiment, each of the adaptive blocks 201 or a combination of multiple adaptive blocks 201 is programmed over the programmable fabric 250 to build a variety of analog circuitry for various power applications. Examples of such power applications include, but are not limited to a switching converter, a linear regulator, a load switch, a sensor, a battery charger, and an external switching controller. According to other embodiments, each of the adaptive blocks 201 or a combination of multiple adaptive blocks 201 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 201 and one or more of functional blocks (e.g., the functional blocks 104 of FIG. 1) and I/O blocks (e.g., the I/O blocks 102 of FIG. 1), the signal wrappers 202 of the analog and digital adaptive platform 200A can provide a digital proportional-integral-derivative (PID) control to various analog actuators including, but not limited to, a DC motor, a servo motor, a stepper motor, a motion control, breakers, and a fan controller.

Figure 2B:
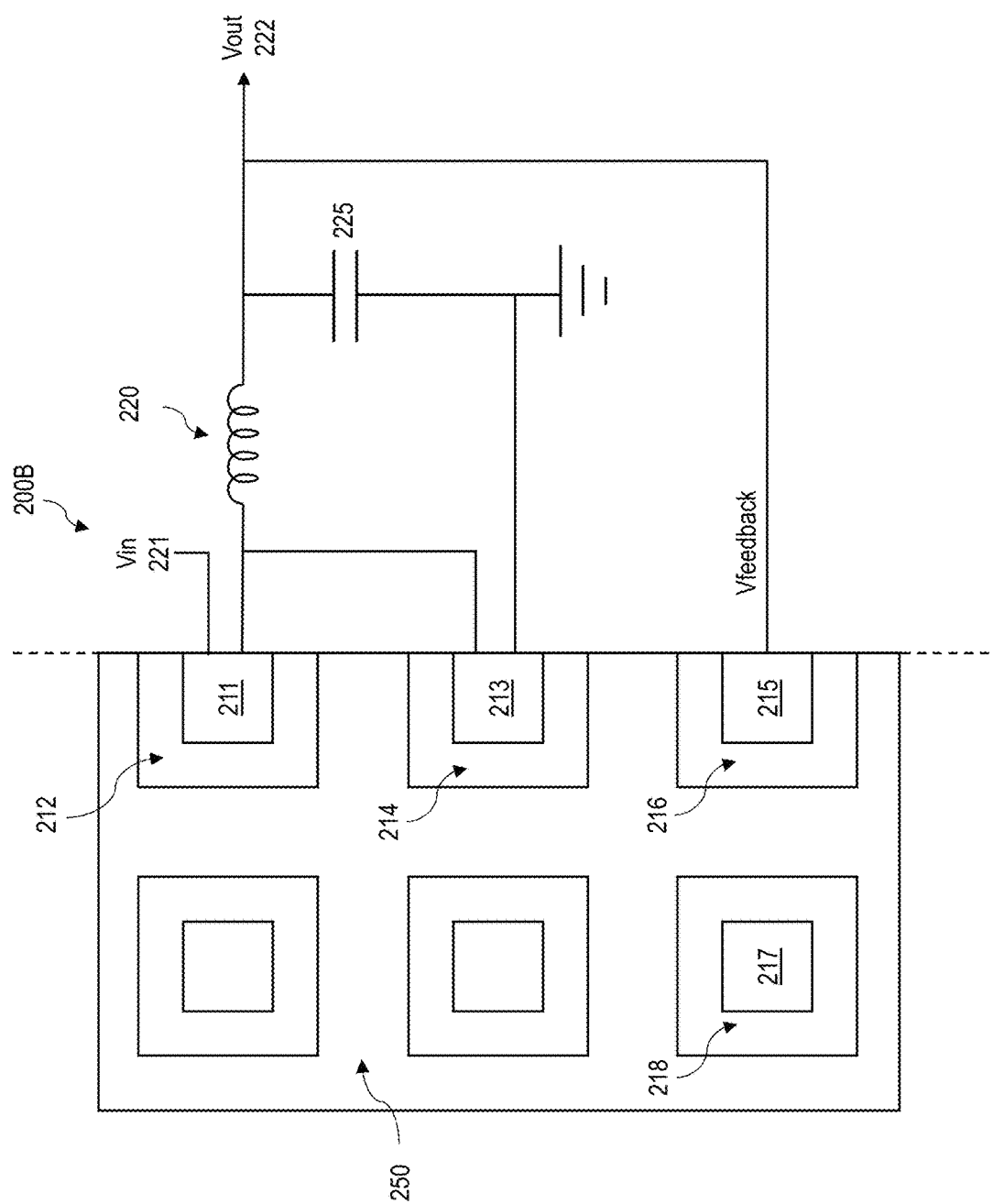
FIG. 2B illustrates an example of the analog and digital adaptive platform of FIG. 2A configured as a hysteretic mode buck switching converter, according to one embodiment.

FIG. 2B illustrates an example of the analog and digital adaptive platform of FIG. 2A configured as a hysteretic mode buck switching converter, according to one embodiment. The hysteretic mode buck switching converter 200B may also be referred to as a bang-bang buck switching converter. The hysteretic mode buck switching converter 200B is a DC-to-DC step-down power converter that converts an input voltage Vin 221 to an output voltage Vout 222 that is lower than the input voltage. The output current may be stepped up while the input voltage is stepped down. The hysteretic mode buck switching converter 200B can provide an efficient power conversion compared to a linear regulator that lowers the input voltage by dissipating power as heat without stepping up the output current.

The analog and digital adaptive platform 200B can be an example of the analog and digital adaptive platform 200A shown in FIG. 2A. For example, the adaptive blocks 211, 213, 215 and 217 are instances of the adaptive blocks 201 of FIG. 2A, the signal wrappers 212, 214, 216, and 218 are instances of the signal wrapper 202 of FIG. 2A. Each of the adaptive blocks 211, 213, 215 and 217 can be one of a comparator block, a memory block, a PWM block, a voltage reference block, and a timer block.

In the present example, the adaptive block 215 is a comparator block. According to one embodiment, the comparator block is included in the analog functional blocks 106 of FIG. 1. The adaptive blocks 211 and 213 drive a filter including an inductor 220 and a capacitor 225 in a synchronous mode. The feedback voltage, $V_{feedback}$, of the filter output 222 (e.g., 1.0V, 4 A) is connected to the comparator block 215. Various internal connections and routing channels are configured to interconnect the adaptive blocks 211, 213, 215 and 217. For example, the adaptive block 217 and the adaptive block 215 are interconnected using the signal wrapper 218 that provides a digital interface to the adaptive block 217, and the signal wrapper 216 that provides a digital interface to the adaptive block 215 via the programmable fabric 250. In a similar fashion, the adaptive block 217 and the adaptive block 213 can be interconnected with the signal wrapper 218 and signal wrapper 214, and the adaptive block 217 and the adaptive block 211 can be interconnected with the signal wrapper 218 and the signal wrapper 212 via the programmable fabric 250. In this example, the adaptive blocks 211, 213, 215 and 217 are configured as a hysteretic mode buck switching converter to provide a stepped-down voltage output.

Figure 3A:
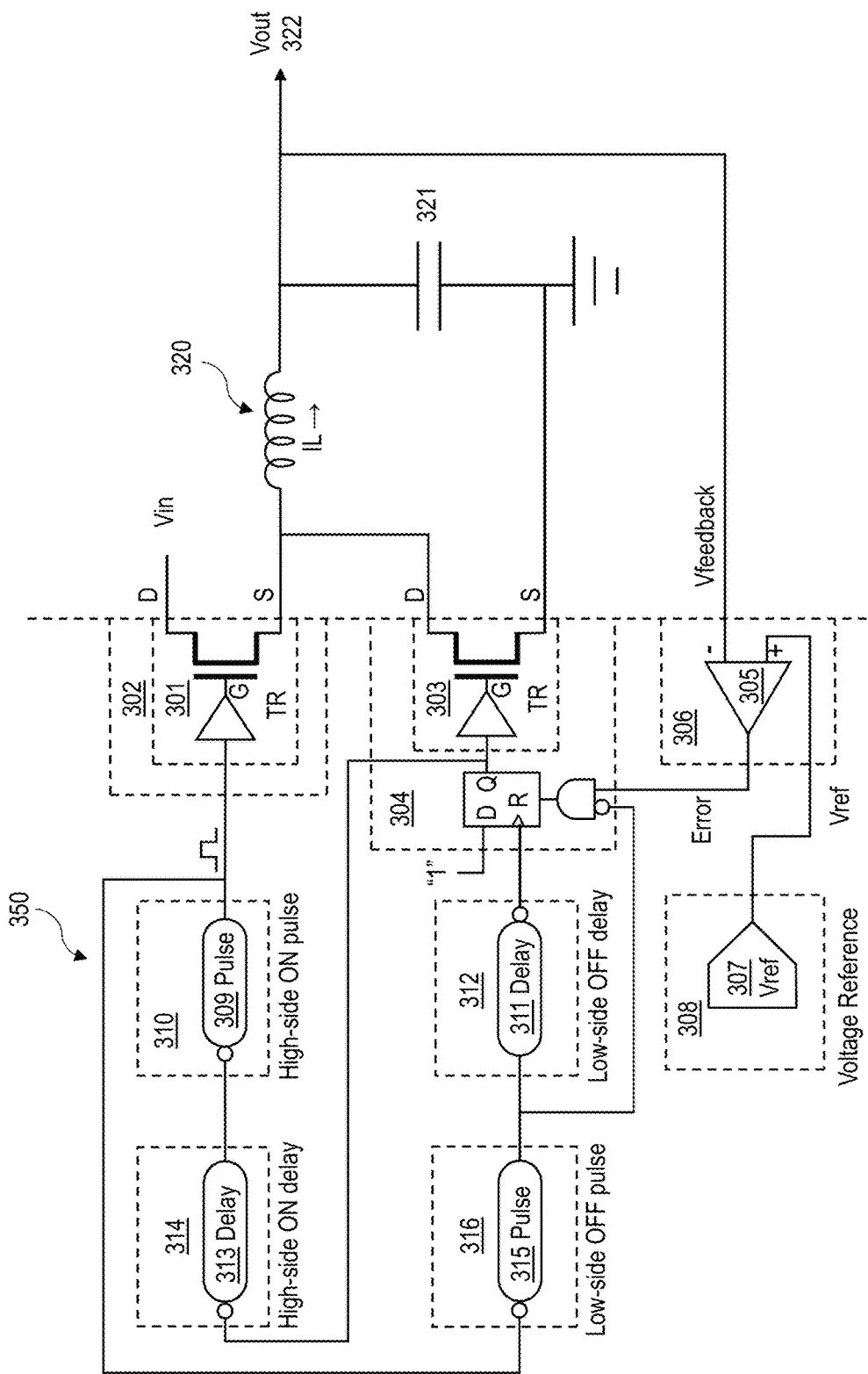
FIG. 3A illustrates a schematic diagram of an example hysteretic mode buck switching converter, according to one embodiment.
Figure 3B:
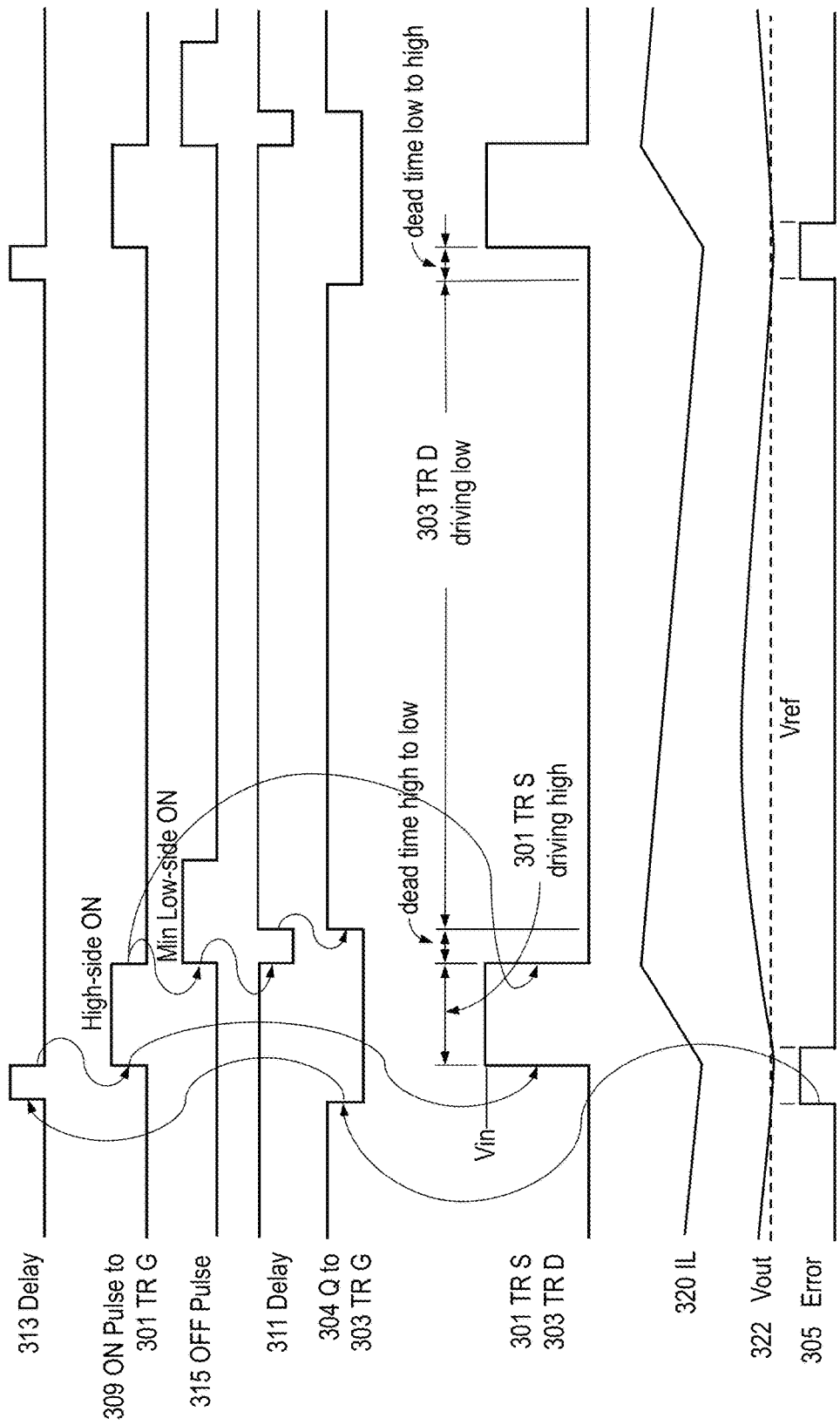
FIG. 3B is a signal diagram for the example hysteretic mode buck switching converter of FIG. 3A.

FIG. 3A illustrates a schematic diagram of an example hysteretic mode buck switching converter, according to one embodiment. The hysteretic mode buck switching converter shown in FIG. 3A may also be referred to as a bang-bang buck switching converter. FIG. 3B is a signal diagram for the example hysteretic mode buck switching converter of FIG. 3A. Although the present example shows an example of the analog and digital adaptive platform configured as a hysteretic mode buck switching converter, it is understood that the present adaptive platform can be configured as other devices including, but not limited to, a voltage mode buck switching converter, a current mode buck switching converter, a boost regulator, a buck-boost regulator, a low drop-out (LDO) regulator, a load switch, a mux, a battery charger, an external switching controller, a gate driver, and an integrator combining one or more thereof.

The programmable fabric can include a plurality of adaptive blocks, 301, 303, 305, 307, 309, 311, 313, and 315, each of which wrapped with respective signal wrappers 302, 304, 306, 308, 310, 312, 314, and 316. Among the adaptive blocks, the adaptive blocks 301 and 303 are high voltage power transistor blocks, the adaptive block 305 is a comparator block, the adaptive blocks 309, 311, 313, and 315 are timer blocks, and the adaptive block 307 is a voltage reference block.

Each of the high voltage power transistor blocks (e.g., the high voltage power transistor blocks 301 and 303) can be programmed for a specific target application and configured as, for example, but not limited to, a switcher, a linear operator, a current sense, and a protector. In the present example, the high voltage power transistor blocks 301 and 303 are programmed and configured as a switcher driving a high current output.

The comparator block 305 is configured to compare a voltage difference between an internal reference from the voltage reference block 307 and an external analog I/O signal $V_{feedback}$.

A timer block (e.g., the timer blocks 309, 311, 313, and 315) can be programmed to generate nanosecond, microsecond, and millisecond delays or pulses. The timer block can provide a precision dead-time control for improved efficiency. In the present example, the timer blocks 309 and 315 provide a constant-on-time pulse, and the timer blocks 311 and 313 are timers with a fixed delay specified by configuration.

A voltage reference block (e.g., the voltage reference block 307) can be used to provide a digitally-adjustable precision voltage reference. The voltage reference block can also provide protection for over current (OCP), over voltage (OVP), over temperature protection (OTP), under voltage-lockout (UVLO) references. In the present example, the voltage reference block 307 provides a fixed voltage reference specified at configuration, which provides the desired output voltage, $V_{ref}$.

The high voltage power transistor blocks 301 and 303 can drive the filter inductor 320 and the capacitor 321 in a synchronous mode as described in the signal diagram of FIG. 3B. The feedback voltage, $V_{feedback}$, from the filter output 322, $V_{out}$, is externally connected to the comparator block 305. The comparator block 305 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 307 interconnected with the signal wrapper 308 and the signal wrapper 306 via the programmable fabric 350.

When the error signal 305 is true, the D-type flip-flop in the signal wrapper 304 is reset to turn off the high voltage power transistor block 303 and start the delay timer block 313. After this delay, the timer block 309 generates a constant-on-time pulse to turn on the high voltage power transistor block 301 through the connection made with signal wrapper 310 and signal wrapper 302 via the programmable fabric 350. The high voltage power transistor block 301 drives the inductor 320 to charge the output capacitor 321. When the pulse is completed, the falling edge of the pulse starts the minimum low-side ON pulse of the timer block 315 and sets the D-type flip-flop in the signal wrapper 304 after a fixed delay determined by the timer block 311 as shown in the signal diagram of FIG. 3B through the connection established with the signal wrapper 312 and the signal wrapper 304, and the connection established with the signal wrapper 310 and the signal wrapper 316 via the programmable fabric 350. The fixed delay is specified to ensure that the high-drive voltage power transistor block 301 is off, dead time, before the low-drive high voltage power transistor block 303 is turned on, preventing momentary shoot-through current as shown in the signal diagram of FIG. 3B. The D-type flip-flop in the signal wrapper 304 turns on the high voltage power transistor block 303 driving the inductor 320 to discharge the output capacitor 321.

The next cycle begins by first tuning off the low-side high voltage power transistor block 303 with a fixed delay reset pulse from the timer block 313 where the fixed delay is specified to ensure that the low-drive high voltage power transistor block 303 is off, dead time, before the high-drive voltage power transistor block 301 is turned on by the timer block 309, again, preventing momentary shoot-through current as shown in the signal diagram of FIG. 3B.

Figure 4:
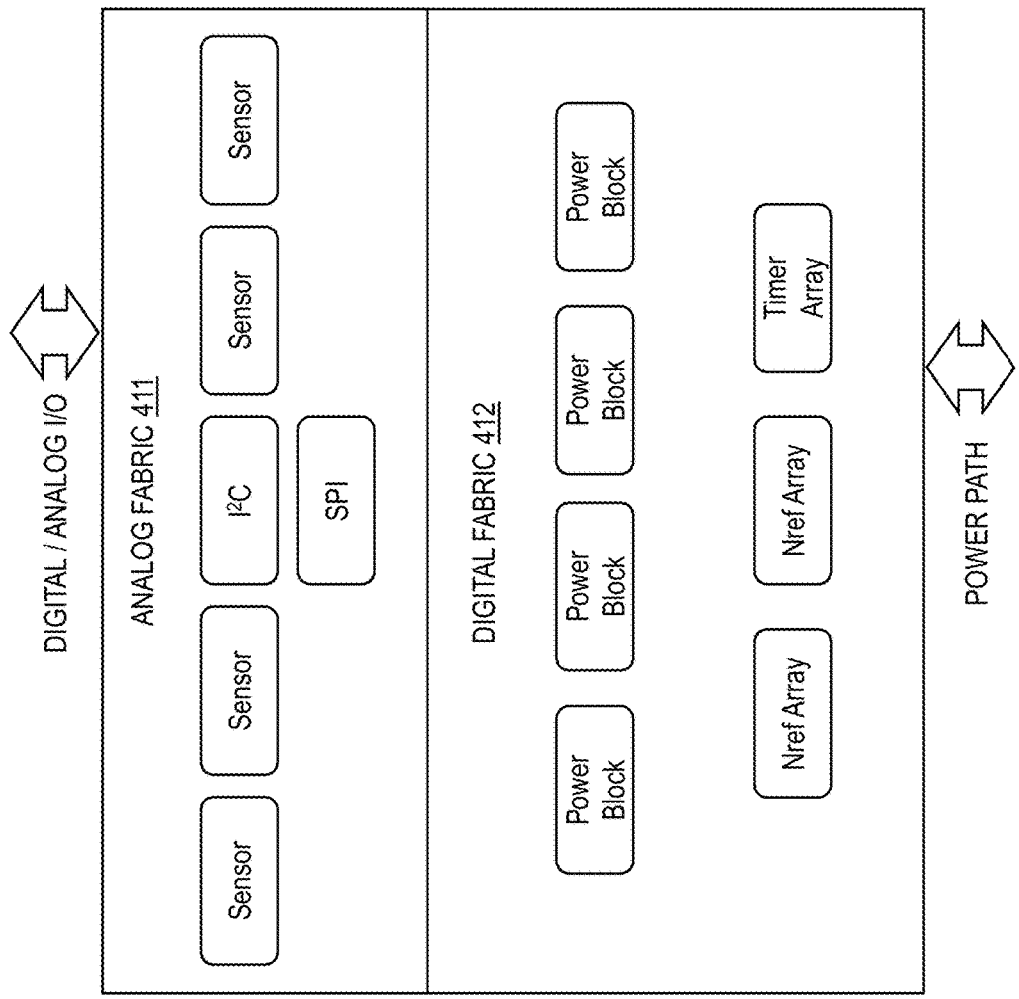
FIG. 4 shows a block diagram of an exemplary programmable logic device, according to one embodiment.

FIG. 4 shows a block diagram of an exemplary programmable logic device, according to one embodiment. The programmable fabric 101 of FIG. 1 may include an analog fabric 411 and a digital fabric 412. The analog fabric 411 corresponds to a portion of the programmable fabric 101 to provide analog interfaces with one or more external telemetry and sensor blocks, an I2C interface, an SPI interface, etc. The digital fabric 412 corresponds to a portion of the programmable fabric 101 that provides digital interfaces among the constituent blocks including the high voltage power transistor blocks 103, and the digital functional blocks 105 including a voltage reference (Nref array) and a timer array. For example, the digital fabric 412 can provide a power path and the connectivity among the integrated analog blocks, digital logic elements, timer arrays, I/O blocks, etc.

It is noted that FIG. 4 is only an example of the present PLD, and it is understood that the present PLD can include any number of power and sensor blocks, for example, four, eight, and twelve power and sensor blocks, and any type of digital and/or analog I/O interfaces without deviating from the scope of the present disclosure.

The present PLD can provide a software-defined and programmable, configurable, and optimizable power MOSFET. The present PLD including software-defined, programmable, and scalable power MOSFETs can accelerate time to market optimizable for new products and standards, accelerate competitive response, lower capital expenditure, operational expenditure, and inventory. The programming and configurability of the present PLD can be easily used to implement new ideas, solutions, and topologies.

The software component of the PLD can be programmed to configure various components, elements, and functions the PLD to configure the PLD as various types of regulators, switches, muxes, battery chargers, switching controllers, gate drivers, etc. Exemplary applications of the present PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

The present disclosure further describes a noise-immune reference (Nref) block integrated in the PLD. The Nref block allows a user to design and implement a noise-immune reference signal with a high precision. The Nref block is one of the adaptive blocks integrated in the present PLD. Referring to FIG. 4, the digital fabric 412 of the present PLD includes an array of noise-immune reference (Nref) blocks. Using the digital fabric, a user can tune the reference signal output from the Nref block to have various characteristics, for example, a soft-start and a soft-stop.

According to one embodiment, the Nref block can be programmed to provide a soft-start reference for a block voltage regulator. The reference signal can be programmed to a specified soft-start ramp up function such as a linear 0V to 1V in 1 millisecond. The voltage regulator can regulate the output signal Vout to follow the Nref block from 0V to 1V in 1 millisecond. This can be accomplished by the programmable digital fabric loading a register in the programmable fabric successively with increasing values at a rate 1V per millisecond from 0V to 1V. When the Nref block reaches 1V, the ramp is stopped and held at 1V that is the reference voltage for the voltage regulator. The soft-start reference allows the voltage regulator to turn on slowly, reducing transients and increasing stability. Similarly, the Nref block can be programmed to a specified soft-stop ramp down function such as a linear 1V to 0V in 1 millisecond enabling the voltage regulator 1000 to soft-stop slowly, reducing transients and increasing stability.

Figure 5:
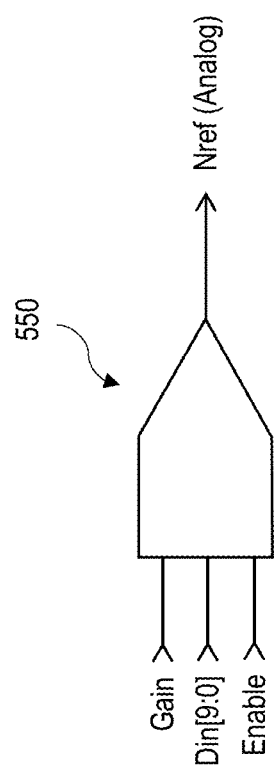
FIG. 5 shows a symbolic block diagram of an exemplary Nref block, according to one embodiment.

FIG. 5 shows a symbolic block diagram of an exemplary Nref block, according to one embodiment. The Nref block 550 can be used to provide a digitally adjustable high-precision voltage reference signal Nref. The Nref block 550 receives inputs including a digital input Din (e.g., a 10-bit signal Din[9:0]), a gain, and an enable signal, and provides the analog output signal Nref. The analog output signal Nref can be used as a reference signal for other adaptive blocks integrated in the PLD. The analog output signal Nref can be digitally controlled using the digital input Din. For example, the range of the analog output voltage signal can be, for example, between 0 and 1.2 volts with a 1.2 mV precision.

According to one embodiment, the 10-bit constant is effectively used to generate a duty cycle of the digital input signal Din. The duty cycle can be represented with a percentage of time of the high voltage to the input of a low-pass filter, and a percentage of the time of the low voltage to the low-pass filter. In the present example, the output signal of the low-pass filter can have the precision of 1.2 mV (1.2V/1024), or just under 1.2 mV per code. The output of the lower-pass filter is amplified by an analog amplifier, and the Nref block 550 can have the output Nref with the 1.2 mV resolution if the signal range is between 0 and 1.2V (2.4 mV if the signal range is between 0 and 2.4V, 3.6 mV if the signal range is between 0 and 3.6V, and 4.5 mV if the signal range is between 0 and 4.5V). The digital input signal Din in a range of 0-1.2V may be shifted to a range between 1.2V-2.4V using a shifter (not shown) to improve the low-frequency filtering by the low-pass filter.

According to one embodiment, the Nref block 550 can be temperature compensated. The Nref block 550 can generate analog voltage references throughout the PLD and can be used as an input to other adaptive blocks of the PLD, for example, an adaptive differential digitizer (ADi) block, an adaptive threshold comparator (ThC) block, an amplifier, and a high voltage power transistor block or I/O blocks of the PLD (e.g., I/O blocks 102 shown in FIG. 1).

According to one embodiment, the Nref block 550 can be configured at a power up of the PLD to provide a reference signal specified by the user. The Nref block 550 can provide an output voltage of a POL with a margin control. The Nref block 550 can provide a soft start/stop ramp rate control. The Nref block 550 can also provide protection for over current (OCP), over voltage (OVP), over temperature protection (OTP), under voltage-lockout (UVLO) references.

Figure 6A:
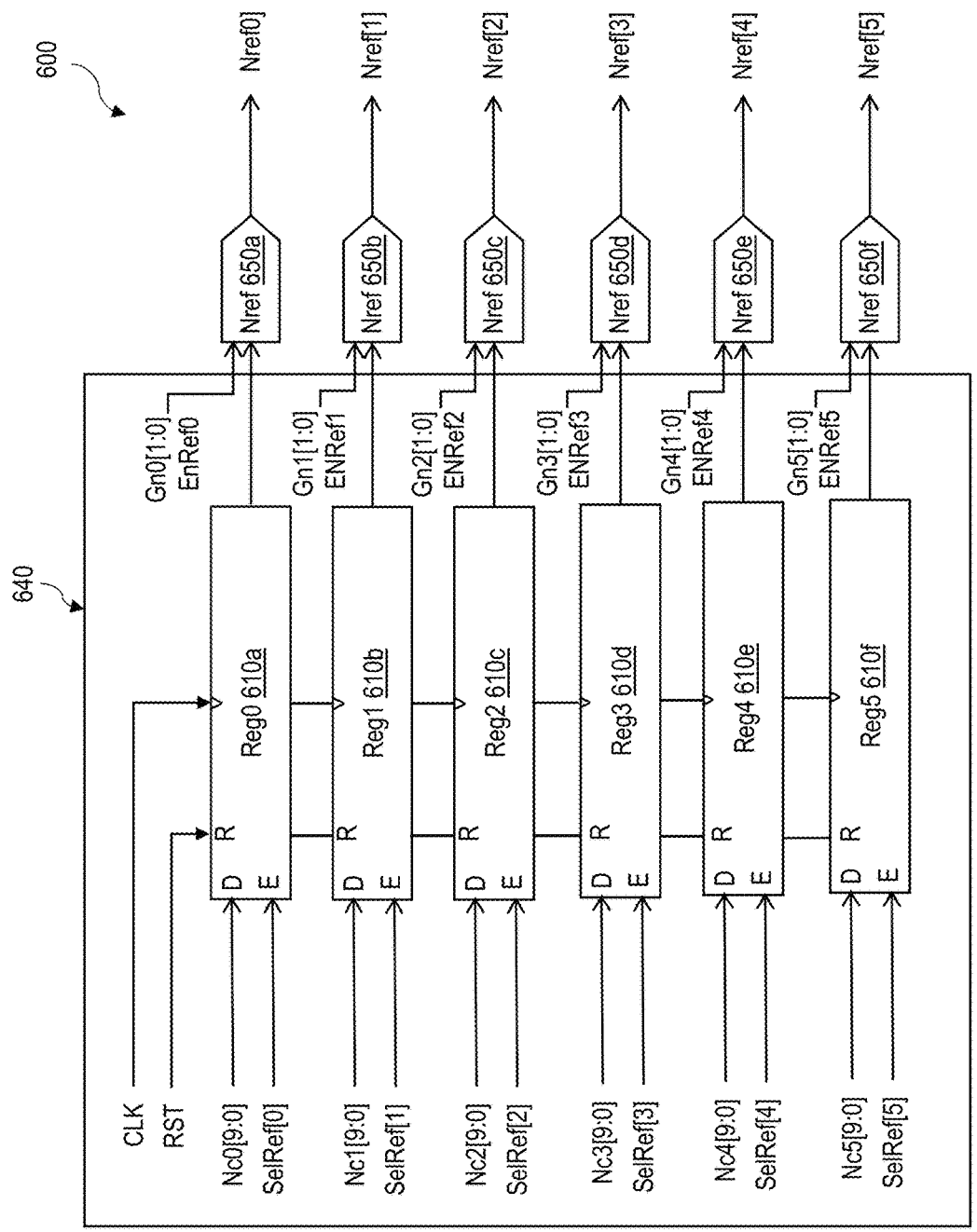
FIG. 6A shows a circuit diagram of an example reference generator including a plurality of Nref blocks, according to one embodiment.

FIG. 6A shows a circuit diagram of an example reference generator including a plurality of Nref blocks, according to one embodiment. The reference generator 600 includes a plurality of registers 610 and a plurality of Nref blocks 650. The registers 610a-610f corresponding to the Nref blocks 650 may be included in a digital signal wrapper that wraps around the Nref blocks 650. In the present example, six registers 610a-610f and six Nref blocks 650a-650f are used; however, it is noted that any number of Nref blocks and registers may be used for each of the Nref blocks without deviating from the scope of the present disclosure.

Each Nref block 650 is coupled with a register 610 available within the digital fabric 640. The register 610 receives a clock signal CLK and a 10-bit voltage data Nc[9:0] from the digital fabric 640 and provides the 10-bit voltage data Nc[9:0] at each clock of the timer. For example, the clock signal CLK may be generated by a PMT block integrated in the PLD, and the clock signal CLK may be provided from the signal wrapper of the PMT block via the digital fabric 640.

The digital voltage of a Nref block 650 can be changed dynamically from the digital fabric 640 of the PLD by providing a 13-bit parameter including EnRef, Gn[1:0], Nc[9:0]; EnRef is an enable signal for the Nref block, Gn is a 2-bit gain multiplier, and Nc is a 10-bit voltage value for a target reference voltage Nref. The target reference voltage Nref is determined by:

$$Nref = Gn * 1.200 * Nc/1024,$$

where Gn=1, 1.5, 3, or 5. Here, 1.2V is a standard reference voltage. The standard reference voltage may be provided by an on-chip band-gap temperature compensated voltage reference. The analog gain is provided by an operational amplifier with a resistor divider feedback programmed from Gn[1:0] in the programmable fabric. The Nref block 650 modulates a fraction of the gained reference according to Nc/1024 duty cycle. An RC filter averages the modulated output to minimize a ripple while allowing a precise response time to dynamic changes in Nc.

The Nref blocks 650a-650f can be independently configured using same clock CLK. One of the Nref blocks 650 can be enabled at a time using the common Nc[9:0]. In some embodiments, common control signals from the programmable fabric can be used to drive the Nref blocks 650a-650f to save pins. Each Nref block 650 has one unique pin SelRef that acts as a clock enable signal to the interface to the digital fabric 640. This enables an independent control of the Nref blocks while sharing the majority of pins. The use of the common control signals is useful for applications with limited inputs available in the programmable fabric.

Figure 6B:
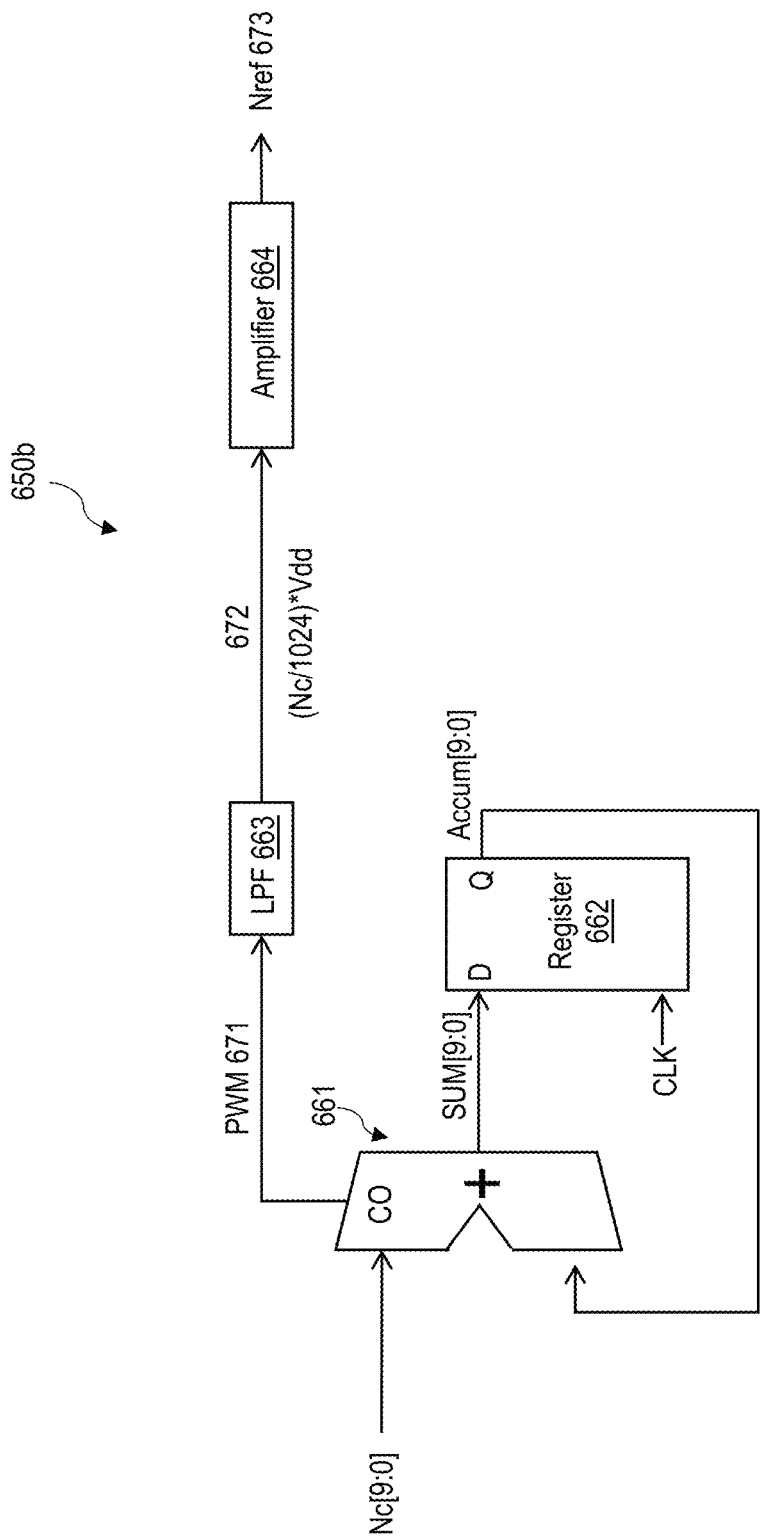
FIG. 6B shows a block diagram of an example DAC included in the Nref block, according to one embodiment.

FIG. 6B shows a block diagram of an example DAC included in the Nref block, according to one embodiment. The DAC 650b includes an adder 661, a register 662, a low-pass filter 663, and a variable gain amplifier 664. The digital input value Nc[9:0] is accumulated using the adder 661 and the register 662 (collectively referred to as an accumulator), and the carry out signal CO is a duty cycle PWM 671 that averages Nc/1024. The PWM 671 is low-pass filtered using the low-pass filter 663 to generate a voltage signal 672 (NC/1024*Vdd). The signal voltage 672 is fed to the variable gain amplifier 664 to generate the reference voltage signal 673.

Figure 6C:
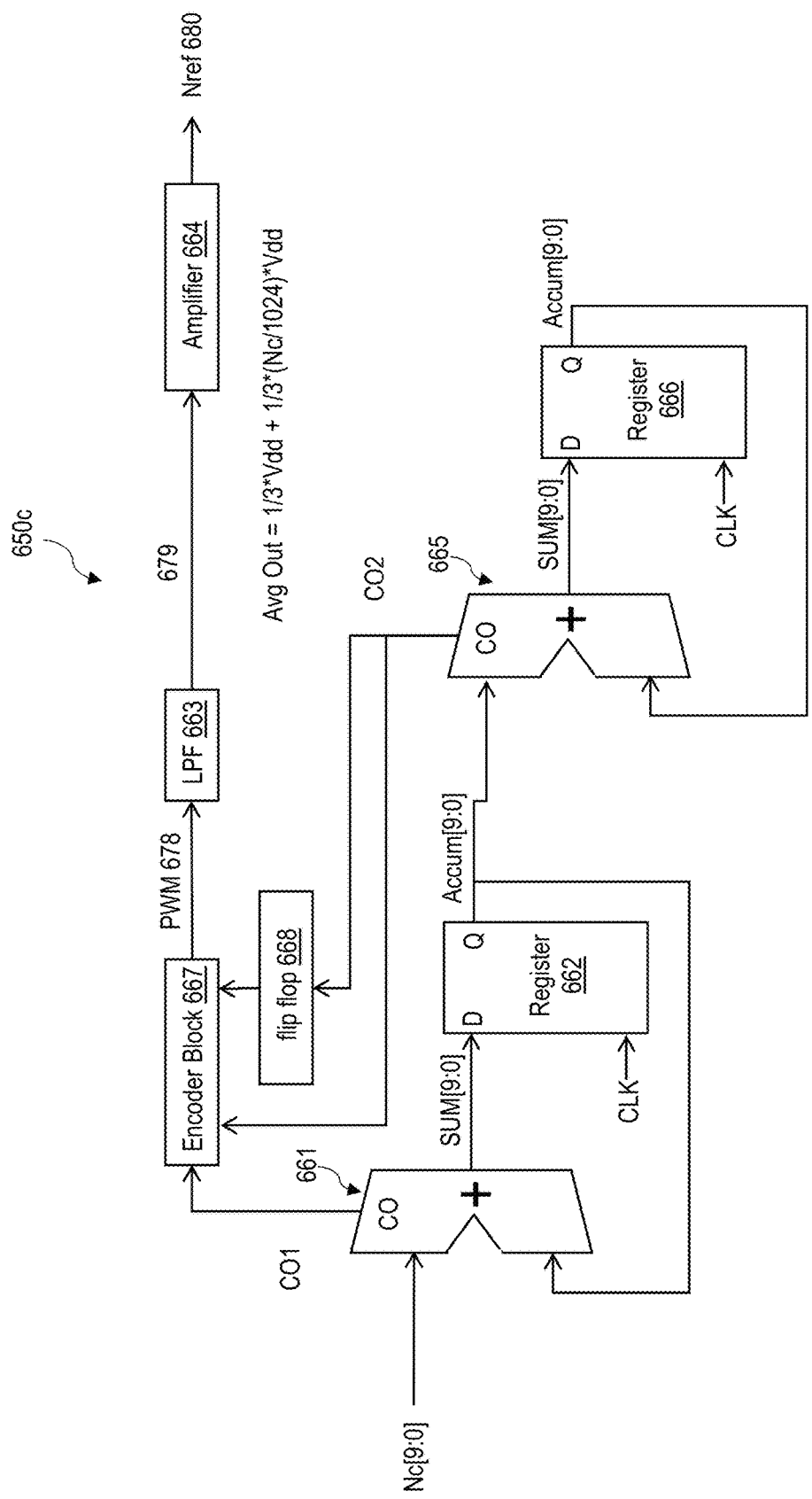
FIG. 6C shows a block diagram of another example DAC included in the Nref block, according to one embodiment.

FIG. 6C shows a block diagram of a second-order DAC included in the Nref block, according to one embodiment. The DAC 650c includes two adders 661 and 665, two registers 662 and 666, an encoder block 667, a low-pass filter 663, and a variable gain amplifier 664. The carry out signal CO1 from the adder 661 is fed to the encoder block 667. The carry out signal CO2 from the adder 665 is fed to the encoder block 667 and a flip flop 668. The output of the flip flop 668 is a delayed carry signal CO2. The encoder block 667 adds CO1, CO2, and the delayed CO2 received from the flip flop 668. The duty cycle PWM 678 averages the added signal and generates a duty cycle PWM 678. The PWM 678 is low-pass filtered using the low-pass filter 664 to generate a voltage signal 679 (⅓*Vdd+⅓*(Nc/1024) *Vdd). The signal voltage 679 is fed to the variable gain amplifier 664 to generate the reference voltage signal 680.

FIG. 6D is a circuit diagram of an example encoding block included in the DAC 650c of FIG. 6C. The encoding block 667 uses the 3-bit encoding as shown in FIG. 6D. Any group of 3 outputs is determined such that the number of 1's=CO1+CO2−delay CO2+1. The 3-bit encoding is shifted on a 3× clock as a PWM waveform to meet the output equation for the voltage signal 679 of FIG. 6C.

FIG. 7 shows examples of target reference voltages and the corresponding gain multipliers. Each of the Nref blocks 650 generates an analog output signal Nref. The digital input value Nc is a 10-bit signal (0-1023), and an analog gain applied by the analog amplifier is selected from a predetermined set, for example, {1, 1.5, 3, 5}. The multiplication is done in an analog gain amplifier while the division is done digitally.

Figure 8:
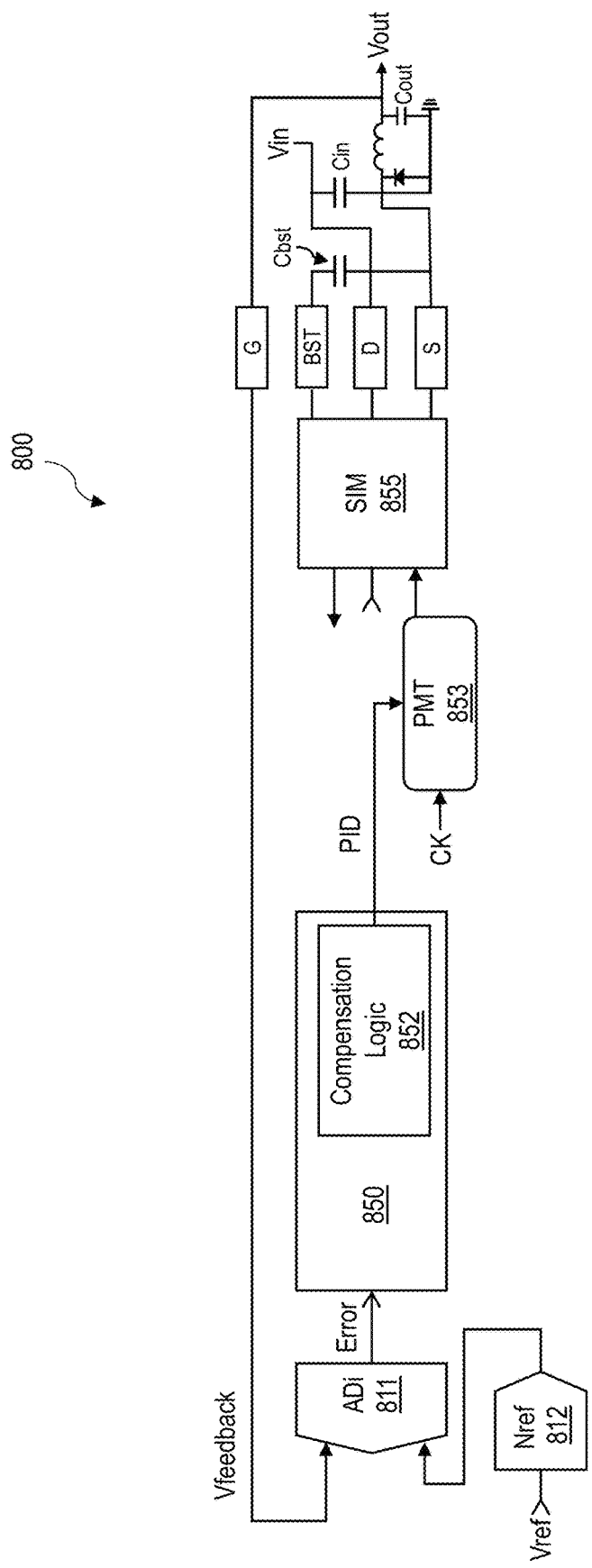
FIG. 8 shows a simplified circuit diagram of a voltage-mode regulator, according to one embodiment.

FIG. 8 shows a simplified circuit diagram of a voltage-mode regulator, according to one embodiment. The present example shows an asynchronous buck regulator 800. The asynchronous buck regulator 800 includes an adaptive error digitizer block 811 (herein also referred to as an ADi block), a voltage reference block 812 (herein also referred to as an Nref block), a compensation memory block 850, a precision modulation timer (PMT) block 853, and a high voltage power transistor block 855 (herein also referred to as a SIM block). The feedback voltage Vfeedback is compared against a reference voltage Vref supplied by the Nref block 812 of the PLD using the ADi block 811. The ADi block 811 produces a digital error that is fed to the compensation memory 850 including an integrated compensation logic 852. The calculated PID value (a sum of the three products E[n]*a, E[n−1]*b, and E[n−2]*c) controls the PMT 853 by setting the PWM pulse width of a duty cycle. The PMT 853 controls the switch of the SIM block 855, turning it on or off as required to maintain the output voltage Vout at a constant voltage level.

The Nref block 812 is configured and programmed with the reference voltage Vref and is used to specify the output voltage Vout, a soft-start, and a soft-stop. The output signal from the Nref block 812, i.e., the reference voltage Vref, is compared with the feedback voltage Vfeedback in the ADi block 811 to provide the error signal to the compensation logic 852. Soft-start ramps the output voltage Vout by dynamically loading the Nref block 812 with a specified digital ramp function to control the rate of the output voltage Vout increasing from zero to the reference voltage Vref. Similarly, soft-stop ramps the output voltage Vout by dynamically loading the Nref block 812 with a specified digital ramp function to control the rate of the output voltage Vout decreasing from the reference voltage Vref to zero.

Referring to FIG. 3A, the voltage Reference 307 is configured and programmed with the reference voltage Vref that is compared with the feedback voltage Vfeedback 305 to provide an error signal to turn off the transistor 303 when the output voltage Vout is above the reference voltage Vref.

Figure 9:
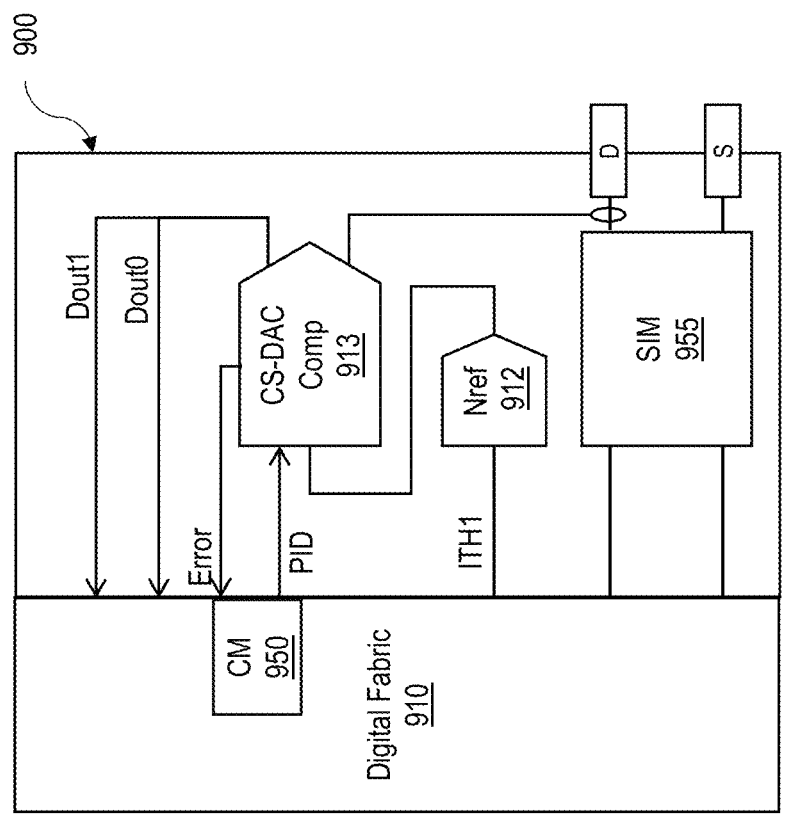
FIG. 9 shows a simplified block diagram of an integrated current-mode regulator, according to one embodiment.

FIG. 9 shows a simplified block diagram of an integrated current-mode regulator, according to one embodiment. The current-mode regulator 900 interfaces with a digital fabric 910 that provides connection of signals among blocks integrated in a PLD. The current-mode regulator 900 includes a SIM block 955, an Nref block 912, and a current-sensing DAC comparator block 913. The current through the SIM block 955 is compared against a current reference provided by the Nref block 912. The CS-DAC comparator block 913 compares the current reference from the Nref block 912 and the current through the SIM block 955 values and provides a current feedback control loop. The current feedback control loop of the current-mode regulator 900 uses a compensation memory block 950 and calculates a compensation value that feeds the CS-DAC comparator block 913. The configuration shown in FIG. 9 provides current-mode regulator 900 with digital compensation. According to another embodiment, the current-mode regulation can support overcurrent threshold protection and slope compensation.

The Nref block 912 is configured and programmed with the current ITH1 to provide a reference for the CS-DAC comparator 913 to specify over-current protection above the level ITH1.

Figure 10:
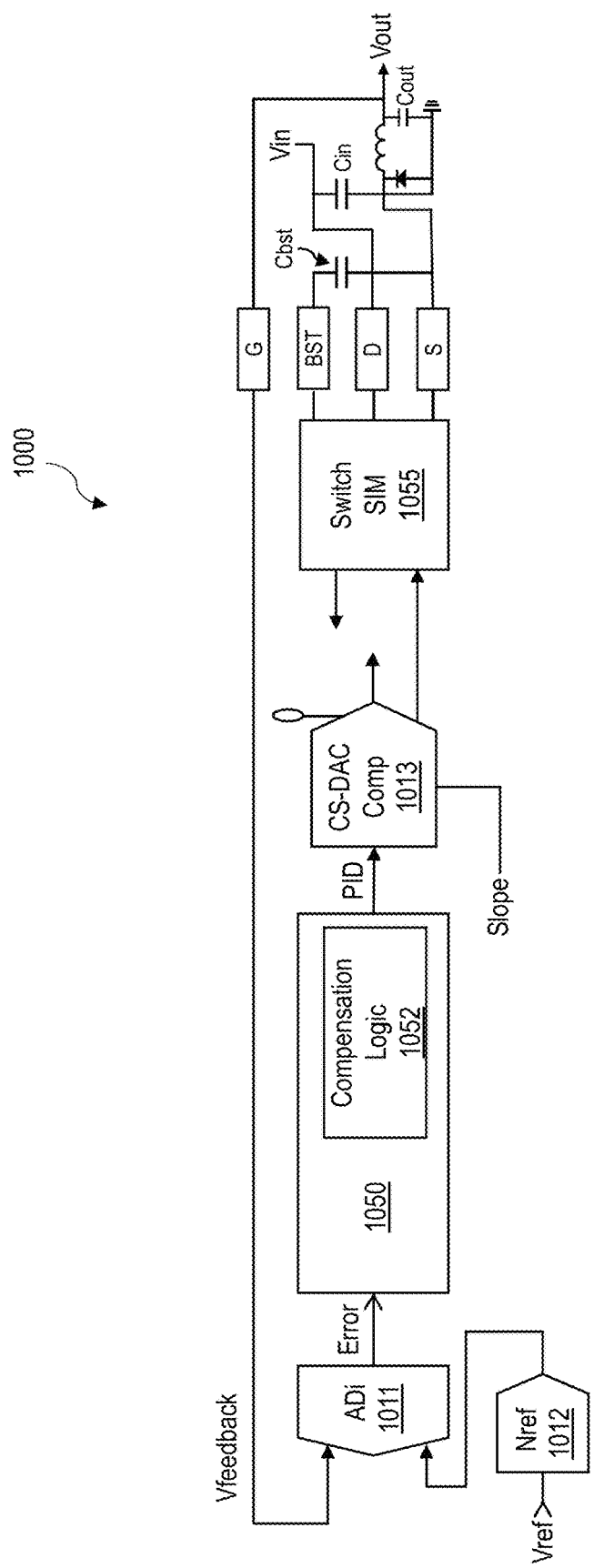
FIG. 10 shows a simplified circuit diagram of a current-mode regulator, according to one embodiment.

FIG. 10 shows a simplified circuit diagram of a current-mode regulator, according to one embodiment. As in the voltage-mode control loop discussed above with reference to FIG. 8, the present example shows an asynchronous buck regulator 1000 operating in a current mode. The asynchronous buck regulator 1000 includes an adaptive error digitizer block 1011 (herein also referred to as ADi block), a voltage reference block 1012 (herein also referred to as an Nref block), a compensation memory block 1050, a current-sensing DAC comparator (CS-DAC) block 1013, and a high voltage power transistor block 1055 (herein also referred to as a SIM block). The feedback voltage Vfeedback is compared against a reference voltage Vref supplied by the Nref block 1012 using the ADi block 1011. The ADi block 1011 provides an error signal that is fed to the compensation memory block 1050 including an integrated compensation logic 1052. In the current-mode regulation, the calculated PID signal from the compensation memory 1050 is fed to the CS-DAC comparator block 1013. The PID signal that drives the CS-DAC comparator block 1013 has a specific value of current at which to turn off the switch. That value to turn off the switch can be modified by the slope compensation ramp, depending on when the threshold is reached during the PWM cycle. The high-side switch is turned on at the beginning of the PWM cycle. The pulse width is determined by the CS-DAC comparator block 1013 that turns the switch SIM 1015 off when the target PID current value is reached, thus regulating the inductor current to achieve the Vfeedback with minimum error signal. The CS-DAC block 1013 compares the current flowing through the regulator 1000 against the PID signal to control a switch of the SIM block 1015, turning it off as required to maintain a minimum error at the output signal Vout.

The Nref block 1012 is configured and programmed with the reference voltage Vref that is compared with the feedback voltage Vfeedback in ADi 1011 to provide an error signal to PID compensator 1052.

The present Nref block provides noise immunity by design of the analog fabric that distributes and shields adjacent analog circuit components and signals. The analog fabric is fully isolated from digital signals on the digital fabric. Routing wire segments of the programmable fabric can minimize cross-talk using a "T" switch interconnect to ensure grounded off-isolation of non-connected segments. The "T" switch can programmably interconnect wire segments of the programmable fabric. If left floating, unused routing wire segments can transmit cross-talk. Grounding the unused non-connected wire segments can further minimize the cross-talk.

A reference voltage block integrated in a programmable logic device (PLD) includes: an accumulator comprising an adder and a register and configured to receive a digital reference value and generate a carry out signal; a low-pass filter configured to receive the carry out signal from the accumulator and generate a filtered signal; and a variable analog gain amplifier configured to amplify the filtered signal using a gain selected from a predetermined set of gains and generate a reference voltage output signal. The PLD includes a programmable fabric and a signal wrapper that is configured to provide signals between the reference voltage block and the programmable fabric. The digital reference value and the predetermined set of gains of the reference voltage block are programmably using the programmable fabric and fed to the reference voltage block via the signal wrapper.

The reference voltage output signal may be fed to an analog fabric of the programmable fabric of the PLD.

The reference voltage block may further include a second accumulator, an encoder block, and a flip flop.

The encoder block may receive input signals including the carry out signal from the accumulator, a second carry out signal from the second accumulator, and a delayed second carry out signal of the second carry out signal and generate a 3-bit output signal encoding the input signals.

The flip flop may receive the second carry out signal from the second accumulator and generate the delayed second carry out signal.

The reference voltage output signal may be fed to an adaptive block of the PLD via the signal wrapper and the programmable fabric.

The adaptive block of the PLD may be a differential digitizer that compares a voltage input signal against the reference voltage output signal.

The reference voltage block may be included in a reference generator of the PLD, and the reference generator may include a plurality of registers and a plurality of reference voltage blocks coupled to the plurality of registers.

The plurality of registers may be included in a digital fabric of the programmable fabric.

Each of the plurality of registers may receive a clock signal and the digital reference value from the digital fabric and provide the digital reference value to the coupled reference voltage block at each clock signal.

The clock signal may be generated by a timer block integrated in the PLD, and the clock signal may be provided from the signal wrapper of the timer block via the digital fabric.

According to another embodiment, a programmable logic device (PLD) includes: a reference voltage block; a programmable fabric; and a signal wrapper configured to provide signals between the reference voltage block and the programmable fabric. The reference voltage block includes: an accumulator comprising an adder and a register and configured to receive a digital reference value and generate a carry out signal; a low-pass filter configured to receive the carry out signal from the accumulator and generate a filtered signal; and a variable analog gain amplifier configured to amplify the filtered signal using a gain selected from a predetermined set of gains and generate a reference voltage output signal. The digital reference value and the predetermined set of gains of the reference voltage block are programmably using the programmable fabric and fed to the reference voltage block via the signal wrapper.

The PLD may further include a differential digitizer comprising a voltage input signal against the reference voltage output signal. The reference voltage output signal may be fed to the differential digitizer via the signal wrapper and the programmable fabric.

The above example embodiments have been described hereinabove to illustrate various embodiments of implementing a system and method for providing a noise-immune reference (Nref) integrated in a PLD. Various modifications and departures from the disclosed example embodiments will occur to those having ordinary skill in the art. The subject matter that is intended to be within the scope of the invention is set forth in the following claims.

What is claimed is:

1. A reference voltage block comprising:
an accumulator configured to receive a digital reference value and generate a carry out signal;
a low-pass filter configured to receive the carry out signal from the accumulator and generate a filtered signal; and
an analog gain amplifier configured to amplify the filtered signal using a gain selected from a predetermined set of gains and generate a reference voltage output signal,
wherein the reference voltage block is integrated in a programmable logic device (PLD) including a programmable fabric and a signal wrapper, and
wherein the digital reference value and the predetermined set of gains of the reference voltage block are programmable using the programmable fabric and fed to the reference voltage block via the signal wrapper.

2. The reference voltage block of claim 1, wherein the reference voltage output signal is fed to an analog fabric of the programmable fabric of the PLD.

3. The reference voltage block of claim 1, wherein the carry out signal is a duty cycle pulse-width modulation (PWM) signal.

4. The reference voltage block of claim 3, wherein the low-pass filter averages the duty cycle PWM signal based on the digital reference value.

5. The reference voltage block of claim 1, further comprising a second accumulator, an encoder block, and a flip flop.

6. The reference voltage block of claim 5, wherein the encoder block receives input signals including the carry out signal from the accumulator, a second carry out signal from the second accumulator, and a delayed second carry out signal of the second carry out signal and generates a 3-bit output signal encoding the input signals.

7. The reference voltage block of claim 6, wherein the flip flop receives the second carry out signal from the second accumulator and generates the delayed second carry out signal.

8. The reference voltage block of claim 1, wherein the reference voltage output signal is fed to an adaptive block of the PLD via the signal wrapper and the programmable fabric.

9. The reference voltage block of claim 8, wherein the adaptive block of the PLD is a differential digitizer that compares a voltage input signal against the reference voltage output signal.

10. The reference voltage block of claim 1, wherein the reference voltage block is included in a reference generator of the PLD, and wherein the reference generator comprises a plurality of registers and a plurality of reference voltage blocks coupled to the plurality of registers.

11. The reference voltage block of claim 10, wherein the plurality of registers is included in a digital fabric of the programmable fabric.

12. The reference voltage block of claim 11, wherein each of the plurality of registers receives a clock signal and the digital reference value from the digital fabric and provides the digital reference value to the coupled reference voltage block at each clock signal.

13. The reference voltage block of claim 12, wherein the clock signal is generated by a timer block integrated in the PLD, and the clock signal is provided from the signal wrapper of the timer block via the digital fabric.

14. A programmable logic device (PLD) comprising:
a reference voltage block;
a programmable fabric; and
a signal wrapper configured to provide signals between the reference voltage block and the programmable fabric,
wherein the reference voltage block comprising:
an accumulator configured to receive a digital reference value and generate a carry out signal;
a low-pass filter configured to receive the carry out signal from the accumulator and generate a filtered signal; and
an analog gain amplifier configured to amplify the filtered signal using a gain selected from a predetermined set of gains and generate a reference voltage output signal, and
wherein the digital reference value and the predetermined set of gains of the reference voltage block are programmable using the programmable fabric and fed to the reference voltage block via the signal wrapper.

15. The PLD of claim 14, wherein the reference voltage output signal is fed to an analog fabric of the programmable fabric.

16. The PLD of claim 14, wherein the carry out signal is a duty cycle pulse-width modulation (PWM) signal.

17. The PLD of claim 16, wherein the low-pass filter averages the duty cycle PWM signal based on the digital reference value.

18. The PLD of claim 14, further comprising a differential digitizer comparing a voltage input signal against the reference voltage output signal, wherein the reference voltage output signal is fed to the differential digitizer via the signal wrapper and the programmable fabric.

19. The PLD of claim 14, wherein the reference voltage block further comprises a second accumulator, an encoder block, and a flip flop, and wherein the encoder block receives input signals including the carry out signal from the accumulator, a second carry out signal from the second accumulator, and a delayed second carry out signal of the second carry out signal and generates a 3-bit output signal encoding the input signals.

20. The PLD of claim 19, wherein the flip flop receives the second carry out signal from the second accumulator and generates the delayed second carry out signal.

* * * * *